(12) United States Patent
Wirth et al.

(10) Patent No.: US 11,117,265 B2
(45) Date of Patent: Sep. 14, 2021

(54) ROBOT FOR SIMULTANEOUS SUBSTRATE TRANSFER

(71) Applicant: Applied Materials, Inc., Santa Clara, CA (US)

(72) Inventors: Paul Z. Wirth, Kalispell, MT (US); Charles T. Carlson, Austin, TX (US); Jason M. Schaller, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/922,805

(22) Filed: Jul. 7, 2020

(65) Prior Publication Data

US 2021/0008727 A1 Jan. 14, 2021

Related U.S. Application Data

(60) Provisional application No. 62/873,480, filed on Jul. 12, 2019.

(51) Int. Cl.
*H01L 21/687* (2006.01)
*B25J 11/00* (2006.01)
(Continued)

(52) U.S. Cl.
CPC ......... *B25J 11/0095* (2013.01); *B25J 9/0009* (2013.01); *B25J 9/042* (2013.01);
(Continued)

(58) Field of Classification Search
None
See application file for complete search history.

(56) References Cited

U.S. PATENT DOCUMENTS 5,667,592 A 9/1997 Boitnott et al.
5,855,465 A 1/1999 Boitnott et al.
(Continued)

FOREIGN PATENT DOCUMENTS

CN 107342243 A 11/2017
JP H11-163075 A 6/1999
(Continued)

OTHER PUBLICATIONS

International Search Report and Written Opinion mailed in International Patent Application No. PCT/US2020/040994, 10 pages.
(Continued)

*Primary Examiner* — Gerald McClain
(74) *Attorney, Agent, or Firm* — Kilpatrick Townsend & Stockton LLP

(57) ABSTRACT

Exemplary substrate processing systems may include a transfer region housing defining a transfer region fluidly coupled with a plurality of processing regions. A sidewall of the transfer region housing may define a sealable access for providing and receiving substrates. The systems may include a transfer apparatus having a central hub including a shaft extending at a distal end through the transfer region housing into the transfer region. The transfer apparatus may include a lateral translation apparatus coupled with an exterior surface of the transfer region housing, and configured to provide at least one direction of lateral movement of the shaft. The systems may also include an end effector coupled with the shaft within the transfer region. The end effector may include a plurality of arms having a number of arms equal to a number of substrate supports of the plurality of substrate supports in the transfer region.

19 Claims, 7 Drawing Sheets

(51) Int. Cl.
*B25J 9/12* (2006.01)
*B25J 9/00* (2006.01)
*B25J 9/04* (2006.01)
*H01L 21/677* (2006.01)
*B25J 15/00* (2006.01)

(52) U.S. Cl.
CPC .......... *B25J 9/12* (2013.01); *H01L 21/67748* (2013.01); *H01L 21/68707* (2013.01); *H01L 21/68771* (2013.01); *H01L 21/68785* (2013.01); *H01L 21/68792* (2013.01); *B25J 15/0014* (2013.01)

(56) References Cited

U.S. PATENT DOCUMENTS

| | | | |
|---|---|---|---|
| 6,962,644 | B2 | 11/2005 | Paterson et al. |
| 9,184,072 | B2 | 11/2015 | Devine et al. |
| 10,109,517 | B1 | 10/2018 | Blank et al. |
| 2004/0127142 | A1* | 7/2004 | Olgado ............ H01L 21/68771 451/5 |
| 2007/0031236 | A1 | 2/2007 | Chen |
| 2007/0034479 | A1 | 2/2007 | Todaka |
| 2007/0207014 | A1 | 9/2007 | Toshima |
| 2010/0294199 | A1 | 11/2010 | Tran et al. |
| 2013/0059440 | A1 | 3/2013 | Wang |
| 2013/0269609 | A1 | 10/2013 | Leeser |
| 2015/0063957 | A1 | 3/2015 | Olgado |
| 2016/0355927 | A1* | 12/2016 | Weaver ............ H01L 21/68771 |
| 2017/0040204 | A1 | 2/2017 | Kim et al. |
| 2017/0306493 | A1 | 10/2017 | Raj et al. |
| 2019/0164790 | A1 | 5/2019 | Liu |
| 2020/0402827 | A1* | 12/2020 | Uziel ................ H01L 21/68764 |
| 2021/0013068 | A1* | 1/2021 | Schaller ............. B65G 47/907 |

FOREIGN PATENT DOCUMENTS

| | | |
|---|---|---|
| JP | 2007-049157 A | 2/2007 |
| JP | 4951201 B2 | 6/2012 |
| JP | 5463367 B2 | 4/2014 |
| KR | 10-0376963 B1 | 3/2003 |
| KR | 2007-0053538 A | 5/2007 |
| KR | 101394111 B1 | 5/2014 |
| KR | 2015-0101785 A | 9/2015 |
| KR | 10-1715887 B1 | 3/2017 |
| KR | 2019-0074481 A | 6/2019 |

OTHER PUBLICATIONS

International Search Report and Written Opinion dated Oct. 20, 2020 in International Patent Application No. PCT/US2020/041015, 11 pages.

International Search Report and Written Opinion dated Oct. 13, 2020 in International Patent Application No. PCT/US2020/041103, 7 pages.

International Search Report and Written Opinion dated Oct. 29, 2020 in International Patent Application No. PCT/US2020/041202, 10 pages.

International Search Report and Written Opinion dated Oct. 29, 2020 in International Patent Application No. PCT/US2020/041157, 11 pages.

International Search Report and Written Opinion dated Oct. 23, 2020 in International Patent Application No. PCT/US2020/041156, 9 pages.

* cited by examiner

ROBOT FOR SIMULTANEOUS SUBSTRATE TRANSFER

CROSS-REFERENCES TO RELATED APPLICATIONS

This application claims the benefit of priority of U.S. Provisional Patent Application No. 62/873,480, filed 12 Jul. 2019, the content of which is hereby incorporated by reference in its entirety for all purposes. The present technology is further related to the following applications, all concurrently filed 12 Jul. 2019, and titled: "ROBOT FOR SIMULTANEOUS SUBSTRATE TRANSFER" (U.S. Provisional Patent Application No. 62/873,400), "ROBOT FOR SIMULTANEOUS SUBSTRATE TRANSFER" (U.S. Provisional Patent Application No. 62/873,432), "ROBOT FOR SIMULTANEOUS SUBSTRATE TRANSFER" (U.S. Provisional Patent Application No. 62/873,458), "MULTI-LID STRUCTURE FOR SEMICONDUCTOR PROCESSING SYSTEMS" (U.S. Provisional Patent Application No. 62/873,518), and "HIGH-DENSITY SUBSTRATE PROCESSING SYSTEMS AND METHODS" (U.S. Provisional Patent Application No. 62/873,503). Each of these applications is hereby incorporated by reference in their entirety for all purposes.

TECHNICAL FIELD

The present technology relates to semiconductor processes and equipment. More specifically, the present technology relates to substrate handling systems.

BACKGROUND

Semiconductor processing systems often utilize cluster tools to integrate a number of process chambers together. This configuration may facilitate the performance of several sequential processing operations without removing the substrate from a controlled processing environment, or it may allow a similar process to be performed on multiple substrates at once in the varying chambers. These chambers may include, for example, degas chambers, pretreatment chambers, transfer chambers, chemical vapor deposition chambers, physical vapor deposition chambers, etch chambers, metrology chambers, and other chambers. The combination of chambers in a cluster tool, as well as the operating conditions and parameters under which these chambers are run, are selected to fabricate specific structures using particular process recipes and process flows.

Cluster tools often process a number of substrates by continuously passing substrates through a series of chambers and process operations. The process recipes and sequences will typically be programmed into a microprocessor controller that will direct, control, and monitor the processing of each substrate through the cluster tool. Once an entire cassette of wafers has been successfully processed through the cluster tool, the cassette may be passed to yet another cluster tool or stand-alone tool, such as a chemical mechanical polisher, for further processing.

Robots are typically used to transfer the wafers through the various processing and holding chambers. The amount of time required for each process and handling operation has a direct impact on the throughput of substrates per unit of time. Substrate throughput in a cluster tool may be directly related to the speed of the substrate handling robot positioned in a transfer chamber. As processing chamber configurations are further developed, conventional wafer transfer systems may be inadequate.

Thus, there is need for improved systems and methods that can be used to efficiently direct substrates within cluster tool environments. These and other needs are addressed by the present technology.

SUMMARY

Exemplary substrate processing systems may include a transfer region housing defining a transfer region fluidly coupled with a plurality of processing regions. A sidewall of the transfer region housing may define a sealable access for providing and receiving substrates. A plurality of substrate supports may be disposed within the transfer region. The systems may include a transfer apparatus having a central hub including a shaft extending at a distal end through the transfer region housing into the transfer region. The transfer apparatus may include a lateral translation apparatus coupled with an exterior surface of the transfer region housing. The lateral translation apparatus may be configured to provide at least one direction of lateral movement of the shaft. The systems may also include an end effector coupled with the shaft at the distal end of the shaft within the transfer region. The end effector may include a plurality of arms having a number of arms equal to a number of substrate supports of the plurality of substrate supports.

In some embodiments, the plurality of substrate supports may include at least four substrate supports. The transfer apparatus may include a first drive coupled with the shaft and configured to rotate the shaft about a central axis through the shaft. The first drive may include a frameless motor extending about the shaft. The transfer apparatus may include a second drive coupled with the shaft and configured to provide vertical translation of the shaft. The first drive may be contained within a housing coupled with guides along which the second drive may direct the housing, and which may vertically translates the first drive and the shaft. The lateral translation apparatus may include a first stage translatable in a first lateral direction, and the central hub may be coupled with the first stage. The lateral translation apparatus may include a second stage translatable in a second lateral direction, and the second stage may be vertically aligned and coupled with the first stage. The second lateral direction may be orthogonal to the first lateral direction. The transfer apparatus may include a bellows through which the shaft extends. The bellows may be fixedly coupled with a baseplate of the transfer apparatus at a first end. The bellows may be sized to afford lateral translation of the shaft within a volume of the bellows.

Some embodiments of the present technology may encompass transfer apparatuses including a baseplate defining a central aperture. The apparatuses may include a shaft, a distal end of which may at least partially extend through the central aperture of the baseplate. The apparatuses may include a lateral translation apparatus coupled with the baseplate. The lateral translation apparatus may be configured to provide at least one direction of lateral movement of the shaft within the central aperture of the baseplate. The apparatuses may include a bellows coupled with the baseplate and axially aligned with the central aperture of the baseplate. The shaft may at least partially extend through the bellows. The apparatuses may include a first drive coupled with the shaft and configured to rotate the shaft about a central axis of the shaft.

In some embodiments, the transfer apparatuses may include a support coupled with the lateral translation apparatus. The support may include one or more guides extending vertically along a surface of the support facing the shaft. The shaft may at least partially be contained within a housing, and the housing may be movably coupled with the guides of the support. A first end of the bellows may be coupled with the baseplate, and a second end of the bellows may be coupled with the housing. The apparatuses may include a second drive coupled with a base of the support. The second drive may be configured to drive the housing vertically along the guides of the support providing vertical translation of the shaft. The second drive may be laterally offset from the first drive. The second drive may be axially aligned with the first drive. The lateral translation apparatus may include a first stage coupled with the baseplate and translatable in a first lateral direction. The bellows may at least partially extend through the first stage. The lateral translation apparatus may include a second stage translatable in a second lateral direction orthogonal to the first lateral direction. The second stage may be vertically aligned with and coupled with the first stage. The bellows may at least partially extend through the second stage.

Some embodiments of the present technology may encompass substrate processing systems. The systems may include a transfer region housing defining a transfer region fluidly coupled with a plurality of processing regions. A sidewall of the transfer region housing may define a sealable access for providing and receiving substrates. A base of the transfer region housing may define an aperture. The systems may include a plurality of substrate supports disposed within the transfer region. The systems may include a transfer apparatus within the transfer region. The transfer apparatus may include a baseplate defining a central aperture. The baseplate may be coupled with an exterior of the base of the transfer region housing. The central aperture of the baseplate may extend about the aperture through the base of the transfer region housing. The transfer apparatus may include a shaft, a distal end of which may at least partially extend through the central aperture of the baseplate. The transfer apparatus may also include a lateral translation apparatus coupled with the baseplate. The lateral translation apparatus may be configured to provide at least one direction of lateral movement of the shaft within the central aperture of the baseplate. The transfer apparatus may include a bellows coupled with the baseplate and axially aligned with the central aperture of the baseplate. The shaft may at least partially extend through the bellows. The transfer apparatus may also include an end effector coupled with the shaft at the distal end of the shaft within the transfer region. The end effector may include a plurality of arms configured to support substrates.

Such technology may provide numerous benefits over conventional systems and techniques. For example, the transfer systems may provide lateral transfer capabilities in addition to rotational movement for substrate transfer. Additionally, the transfer systems may accommodate or limit bending, rotational, and other moments with configurations according to some embodiments of the present technology. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1A:
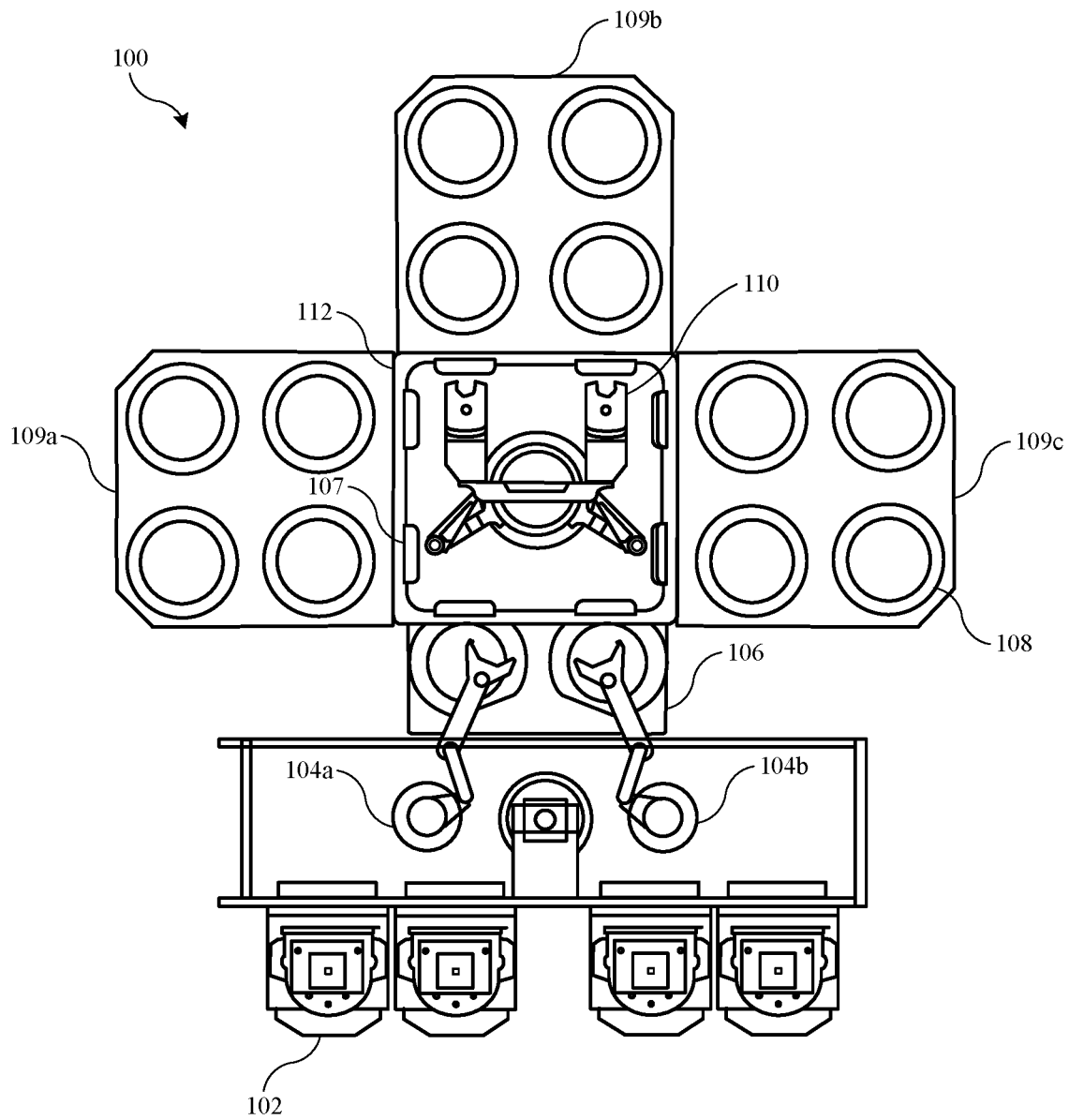
FIG. 1A shows a schematic top plan view of one embodiment of an exemplary processing tool according to some embodiments of the present technology.

Several of the figures are included as schematics. It is to be understood that the figures are for illustrative purposes, and are not to be considered of scale or proportion unless specifically stated to be of scale or proportion. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Substrate processing can include time-intensive operations for adding, removing, or otherwise modifying materials on a wafer or semiconductor substrate. Efficient movement of the substrate may reduce queue times and improve substrate throughput. To improve the number of substrates processed within a cluster tool, additional chambers may be incorporated onto the mainframe. Although transfer robots and processing chambers can be continually added by lengthening the tool, this may become space inefficient as the footprint of the cluster tool scales. Accordingly, the present technology may include cluster tools with an increased number of processing chambers within a defined footprint. To accommodate the limited footprint about transfer robots, the present technology may increase the number of processing chambers laterally outward from the robot. For example, some conventional cluster tools may include one or two processing chambers positioned about sections of a centrally located transfer robot to maximize the number of chambers radially about the robot. The present technology may expand on this concept by incorporating additional chambers laterally outward as another row or group of chambers. For example, the present technology may be applied with cluster tools including three, four, five, six, or more processing chambers accessible at each of one or more robot access positions.

However, as additional process locations are added, accessing these locations from a central robot may no longer be feasible without additional transfer capabilities at each location. Some conventional technologies may include wafer carriers on which the substrates remain seated during transition. However, wafer carriers may contribute to thermal non-uniformity and particle contamination on substrates. The present technology overcomes these issues by incorporating a transfer section vertically aligned with processing chamber regions and a carousel or transfer apparatus that may operate in concert with a central robot to access additional wafer positions. The present technology may not use conventional wafer carriers in some embodiments, and may transfer specific wafers from one substrate support to a different substrate support within the transfer region. Although the remaining disclosure will routinely identify specific structures, such as four-position transfer regions, for which the present structures and methods may be employed, it will be readily understood that the systems and methods are equally applicable to any number of structures and devices that may benefit from the transfer capabilities explained. Accordingly, the technology should not be considered to be so limited as for use with any particular structures alone. Moreover, although an exemplary tool system will be described to provide foundation for the present technology, it is to be understood that the present technology can be incorporated with any number of semiconductor processing chambers and tools that may benefit from some or all of the operations and systems to be described.

FIG. 1A shows a top plan view of one embodiment of a substrate processing tool or processing system 100 of deposition, etching, baking, and curing chambers according to some embodiments of the present technology. In the figure, a set of front-opening unified pods 102 supply substrates of a variety of sizes that are received within a factory interface 103 by robotic arms 104a and 104b and placed into a load lock or low pressure holding area 106 before being delivered to one of the substrate processing regions 108, positioned in chamber systems or quad sections 109a-c, which may each be a substrate processing system having a transfer region fluidly coupled with a plurality of processing regions 108. Although a quad system is illustrated, it is to be understood that platforms incorporating standalone chambers, twin chambers, and other multiple chamber systems are equally encompassed by the present technology. A second robotic arm 110 housed in a transfer chamber 112 may be used to transport the substrate wafers from the holding area 106 to the quad sections 109 and back, and second robotic arm 110 may be housed in a transfer chamber with which each of the quad sections or processing systems may be connected. Each substrate processing region 108 can be outfitted to perform a number of substrate processing operations including any number of deposition processes including cyclical layer deposition, atomic layer deposition, chemical vapor deposition, physical vapor deposition, as well as etch, preclean, anneal, plasma processing, degas, orientation, and other substrate processes.

Each quad section 109 may include a transfer region that may receive substrates from, and deliver substrates to, second robotic arm 110. The transfer region of the chamber system may be aligned with the transfer chamber having the second robotic arm 110. In some embodiments the transfer region may be laterally accessible to the robot. In subsequent operations, components of the transfer sections may vertically translate the substrates into the overlying processing regions 108. Similarly, the transfer regions may also be operable to rotate substrates between positions within each transfer region. The substrate processing regions 108 may include any number of system components for depositing, annealing, curing and/or etching a material film on the substrate or wafer. In one configuration, two sets of the processing regions, such as the processing regions in quad section 109a and 109b, may be used to deposit material on the substrate, and the third set of processing chambers, such as the processing chambers or regions in quad section 109c, may be used to cure, anneal, or treat the deposited films. In another configuration, all three sets of chambers, such as all twelve chambers illustrated, may be configured to both deposit and/or cure a film on the substrate.

As illustrated in the figure, second robotic arm 110 may include two arms for delivering and/or retrieving multiple substrates simultaneously. For example, each quad section 109 may include two accesses 107 along a surface of a housing of the transfer region, which may be laterally aligned with the second robotic arm. The accesses may be defined along a surface adjacent the transfer chamber 112. In some embodiments, such as illustrated, the first access may be aligned with a first substrate support of the plurality of substrate supports of a quad section. Additionally, the second access may be aligned with a second substrate support of the plurality of substrate supports of the quad section. The first substrate support may be adjacent to the second substrate support, and the two substrate supports may define a first row of substrate supports in some embodiments. As shown in the illustrated configuration, a second row of substrate supports may be positioned behind the first row of substrate supports laterally outward from the transfer chamber 112. The two arms of the second robotic arm 110 may be spaced to allow the two arms to simultaneously enter a quad section or chamber system to deliver or retrieve one or two substrates to substrate supports within the transfer region.

Any one or more of the transfer regions described may be incorporated with additional chambers separated from the fabrication system shown in different embodiments. It will be appreciated that additional configurations of deposition, etching, annealing, and curing chambers for material films are contemplated by processing system 100. Additionally, any number of other processing systems may be utilized with the present technology, which may incorporate transfer systems for performing any of the specific operations, such as the substrate movement. In some embodiments, processing systems that may provide access to multiple processing chamber regions while maintaining a vacuum environment in various sections, such as the noted holding and transfer areas, may allow operations to be performed in multiple chambers while maintaining a particular vacuum environment between discrete processes.

Figure 1B:
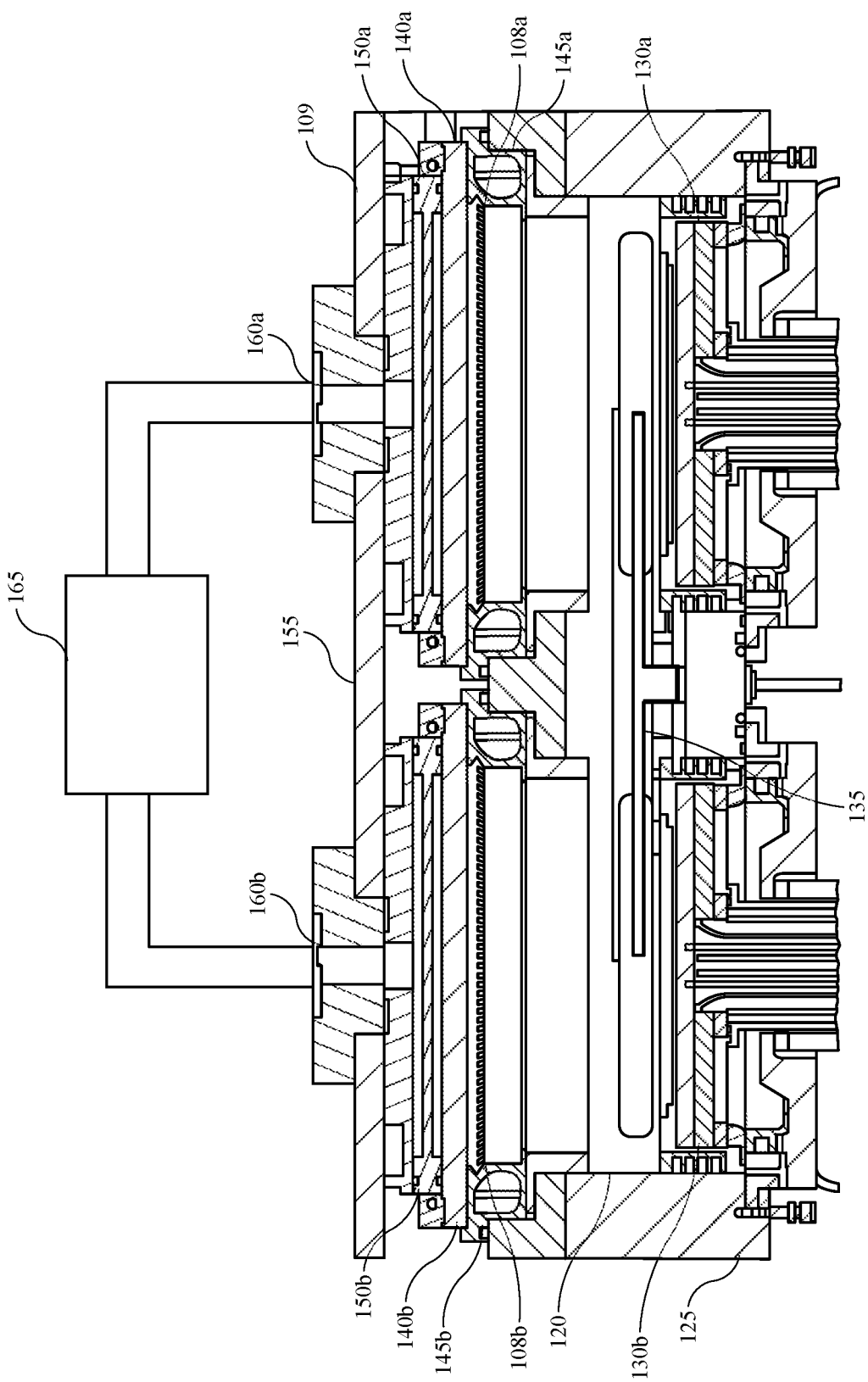
FIG. 1B shows a schematic partial cross-sectional view of one embodiment of an exemplary processing system according to some embodiments of the present technology.

FIG. 1B shows a schematic cross-sectional elevation view of one embodiment of an exemplary processing tool, such as through a chamber system, according to some embodiments of the present technology. FIG. 1B may illustrate a cross-sectional view through any two adjacent processing regions 108 in any quad section 109. The elevation view may illustrate the configuration or fluid coupling of one or more processing regions 108 with a transfer region 120. For example, a continuous transfer region 120 may be defined by a transfer region housing 125. The housing may define an open interior volume in which a number of substrate supports 130 may be disposed. For example, as illustrated in FIG. 1A, exemplary processing systems may include four or more, including a plurality of substrate supports 130 distributed within the housing about the transfer region. The substrate supports may be pedestals as illustrated, although a number of other configurations may also be used. In some embodiments the pedestals may be vertically translatable between the transfer region 120 and the processing regions overlying the transfer region. The substrate supports may be vertically translatable along a central axis of the substrate support along a path between a first position and a second position within the chamber system. Accordingly, in some embodiments each substrate support 130 may be axially aligned with an overlying processing region 108 defined by one or more chamber components.

The open transfer region may afford the ability of a transfer apparatus 135, such as a carousel, to engage and move substrates, such as rotationally, between the various substrate supports. The transfer apparatus 135 may be rotatable about a central axis. This may allow substrates to be positioned for processing within any of the processing regions 108 within the processing system. The transfer apparatus 135 may include one or more end effectors that may engage substrates from above, below, or may engage exterior edges of the substrates for movement about the substrate supports. The transfer apparatus may receive substrates from a transfer chamber robot, such as robot 110 described previously. The transfer apparatus may then rotate substrates to alternate substrate supports to facilitate delivery of additional substrates.

Once positioned and awaiting processing, the transfer apparatus may position the end effectors or arms between substrate supports, which may allow the substrate supports to be raised past the transfer apparatus 135 and deliver the substrates into the processing regions 108, which may be vertically offset from the transfer region. For example, and as illustrated, substrate support 130a may deliver a substrate into processing region 108a, while substrate support 130b may deliver a substrate into processing region 108b. This may occur with the other two substrate supports and processing regions, as well as with additional substrate supports and processing regions in embodiments for which additional processing regions are included. In this configuration, the substrate supports may at least partially define a processing region 108 from below when operationally engaged for processing substrates, such as in the second position, and the processing regions may be axially aligned with an associated substrate support. The processing regions may be defined from above by a faceplate 140, as well as other lid stack components. In some embodiments, each processing region may have individual lid stack components, although in some embodiments components may accommodate multiple processing regions 108. Based on this configuration, in some embodiments each processing region 108 may be fluidly coupled with the transfer region, while being fluidly isolated from above from each other processing region within the chamber system or quad section.

In some embodiments the faceplate 140 may operate as an electrode of the system for producing a local plasma within the processing region 108. As illustrated, each processing region may utilize or incorporate a separate faceplate. For example, faceplate 140a may be included to define from above processing region 108a, and faceplate 140b may be included to define from above processing region 108b. In some embodiments the substrate support may operate as the companion electrode for generating a capacitively-coupled plasma between the faceplate and the substrate support. A pumping liner 145 may at least partially define the processing region 108 radially, or laterally depending on the volume geometry. Again, separate pumping liners may be utilized for each processing region. For example, pumping liner 145a may at least partially radially define processing region 108a, and pumping liner 145b may at least partially radially define processing region 108b. A blocker plate 150 may be positioned between a lid 155 and the faceplate 140 in embodiments, and again separate blocker plates may be included to facilitate fluid distribution within each processing region. For example, blocker plate 150a may be included for distribution towards processing region 108a, and blocker plate 150b may be included for distribution towards processing region 108b.

Lid 155 may be a separate component for each processing region, or may include one or more common aspects. In some embodiments, such as illustrated, lid 155 may be a single component defining multiple apertures 160 for fluid delivery to individual processing regions. For example, lid 155 may define a first aperture 160a for fluid delivery to processing region 108a, and lid 155 may define a second aperture 160b for fluid delivery to processing region 108b. Additional apertures may be defined for additional processing regions within each section when included. In some embodiments, each quad section 109—or multi-processing-region section that may accommodate more or less than four substrates, may include one or more remote plasma units 165 for delivering plasma effluents into the processing chamber. In some embodiments individual plasma units may be incorporated for each chamber processing region, although in some embodiments fewer remote plasma units may be used. For example, as illustrated a single remote plasma unit 165 may be used for multiple chambers, such as two, three, four, or more chambers up to all chambers for a particular quad section. Piping may extend from the remote plasma unit 165 to each aperture 160 for delivery of plasma effluents for processing or cleaning in embodiments of the present technology.

Figure 2:
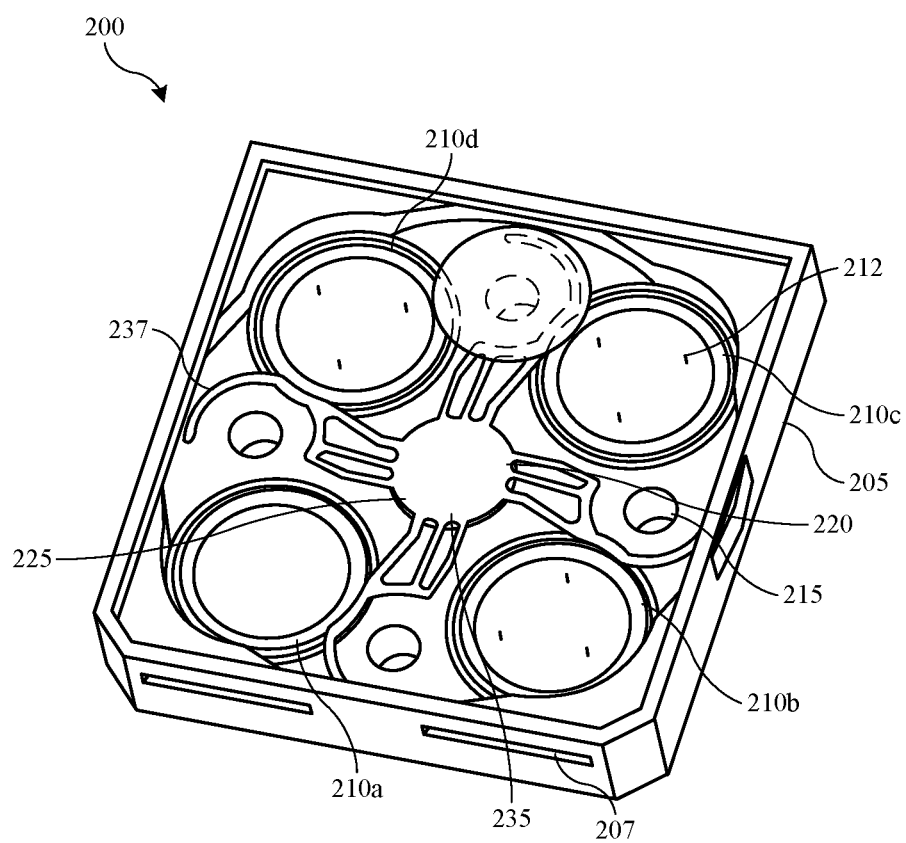
FIG. 2 shows a schematic isometric view of a transfer section of an exemplary substrate processing system according to some embodiments of the present technology.

As noted, processing system 100, or more specifically quad sections or chamber systems incorporated with processing system 100 or other processing systems, may include transfer sections positioned below the processing chamber regions illustrated. FIG. 2 shows a schematic isometric view of a transfer section of an exemplary chamber system 200 according to some embodiments of the present technology. FIG. 2 may illustrate additional aspects or variations of aspects of the transfer region 120 described above, and may include any of the components or characteristics described. The system illustrated may include a transfer region housing 205 defining a transfer region in which a number of components may be included. The transfer region may additionally be at least partially defined from above by processing chambers or processing regions fluidly coupled with the transfer region, such as processing chamber regions 108 illustrated in quad sections 109 of FIG. 1A. A sidewall of the transfer region housing may define one or more access locations 207 through which substrates may be delivered and retrieved, such as by second robotic arm 110 as discussed above. Access locations 207 may be slit valves or other sealable access positions, which include doors or other sealing mechanisms to provide a hermetic environment within transfer region housing 205 in some embodiments. Although illustrated with two such access locations 207, it is to be understood that in some embodiments only a single access location 207 may be included, as well as access locations on multiple sides of the transfer region housing. It is also to be understood that the transfer section illustrated may be sized to accommodate any substrate size, including 200 mm, 300 mm, 450 mm, or larger or smaller substrates, including substrates characterized by any number of geometries or shapes.

Within transfer region housing 205 may be a plurality of substrate supports 210 positioned about the transfer region volume. Although four substrate supports are illustrated, it is to be understood that any number of substrate supports are similarly encompassed by embodiments of the present technology. For example, greater than or about three, four, five, six, eight, or more substrate supports 210 may be accommodated in transfer regions according to embodiments of the present technology. Second robotic arm 110 may deliver a substrate to either or both of substrate supports 210a or 210b through the accesses 207. Similarly, second robotic arm 110 may retrieve substrates from these locations. Lift pins 212 may protrude from the substrate supports 210, and may allow the robot to access beneath the substrates. The lift pins may be fixed on the substrate supports, or at a location where the substrate supports may recess below, or the lift pins may additionally be raised or lowered through the substrate supports in some embodiments. Substrate supports 210 may be vertically translatable, and in some embodiments may extend up to processing chamber regions of the substrate processing systems, such as processing chamber regions 108, positioned above the transfer region housing 205.

The transfer region housing 205 may provide access 215 for alignment systems, which may include an aligner that can extend through an aperture of the transfer region housing as illustrated and may operate in conjunction with a laser, camera, or other monitoring device protruding or transmitting through an adjacent aperture, and that may determine whether a substrate being translated is properly aligned. Transfer region housing 205 may also include a transfer apparatus 220 that may be operated in a number of ways to position substrates and move substrates between the various substrate supports. In one example, transfer apparatus 220 may move substrates on substrate supports 210a and 210b to substrate supports 210c and 210d, which may allow additional substrates to be delivered into the transfer chamber. Additional transfer operations may include rotating substrates between substrate supports for additional processing in overlying processing regions.

Transfer apparatus 220 may include a central hub 225 that may include one or more shafts extending into the transfer chamber. Coupled with the shaft may be an end effector 235. End effector 235 may include a plurality of arms 237 extending radially or laterally outward from the central hub. Although illustrated with a central body from which the arms extend, the end effector may additionally include separate arms that are each coupled with the shaft or central hub in various embodiments. Any number of arms may be included in embodiments of the present technology. In some embodiments a number of arms 237 may be similar or equal to the number of substrate supports 210 included in the chamber. Hence, as illustrated, for four substrate supports, transfer apparatus 220 may include four arms extending from the end effector. The arms may be characterized by any number of shapes and profiles, such as straight profiles or arcuate profiles, as well as including any number of distal profiles including hooks, rings, forks, or other designs for supporting a substrate and/or providing access to a substrate, such as for alignment or engagement.

The end effector 235, or components or portions of the end effector, may be used to contact substrates during transfer or movement. These components as well as the end effector may be made from or include a number of materials including conductive and/or insulative materials. The materials may be coated or plated in some embodiments to withstand contact with precursors or other chemicals that may pass into the transfer chamber from an overlying processing chamber.

Additionally, the materials may be provided or selected to withstand other environmental characteristics, such as temperature. In some embodiments, the substrate supports may be operable to heat a substrate disposed on the support. The substrate supports may be configured to increase a surface or substrate temperature to temperatures greater than or about 100° C., greater than or about 200° C., greater than or about 300° C., greater than or about 400° C., greater than or about 500° C., greater than or about 600° C., greater than or about 700° C., greater than or about 800° C., or higher. Any of these temperatures may be maintained during operations, and thus components of the transfer apparatus 220 may be exposed to any of these stated or encompassed temperatures. Consequently, in some embodiments any of the materials may be selected to accommodate these temperature regimes, and may include materials such as ceramics and metals that may be characterized by relatively low coefficients of thermal expansion, or other beneficial characteristics.

Component couplings may also be adapted for operation in high temperature and/or corrosive environments. For example, where end effectors and end portions are each ceramic, the coupling may include press fittings, snap fittings, or other fittings that may not include additional materials, such as bolts, which may expand and contract with temperature, and may cause cracking in the ceramics. In some embodiments the end portions may be continuous with the end effectors, and may be monolithically formed with the end effectors. Any number of other materials may be utilized that may facilitate operation or resistance during operation, and are similarly encompassed by the present technology.

Figure 3:
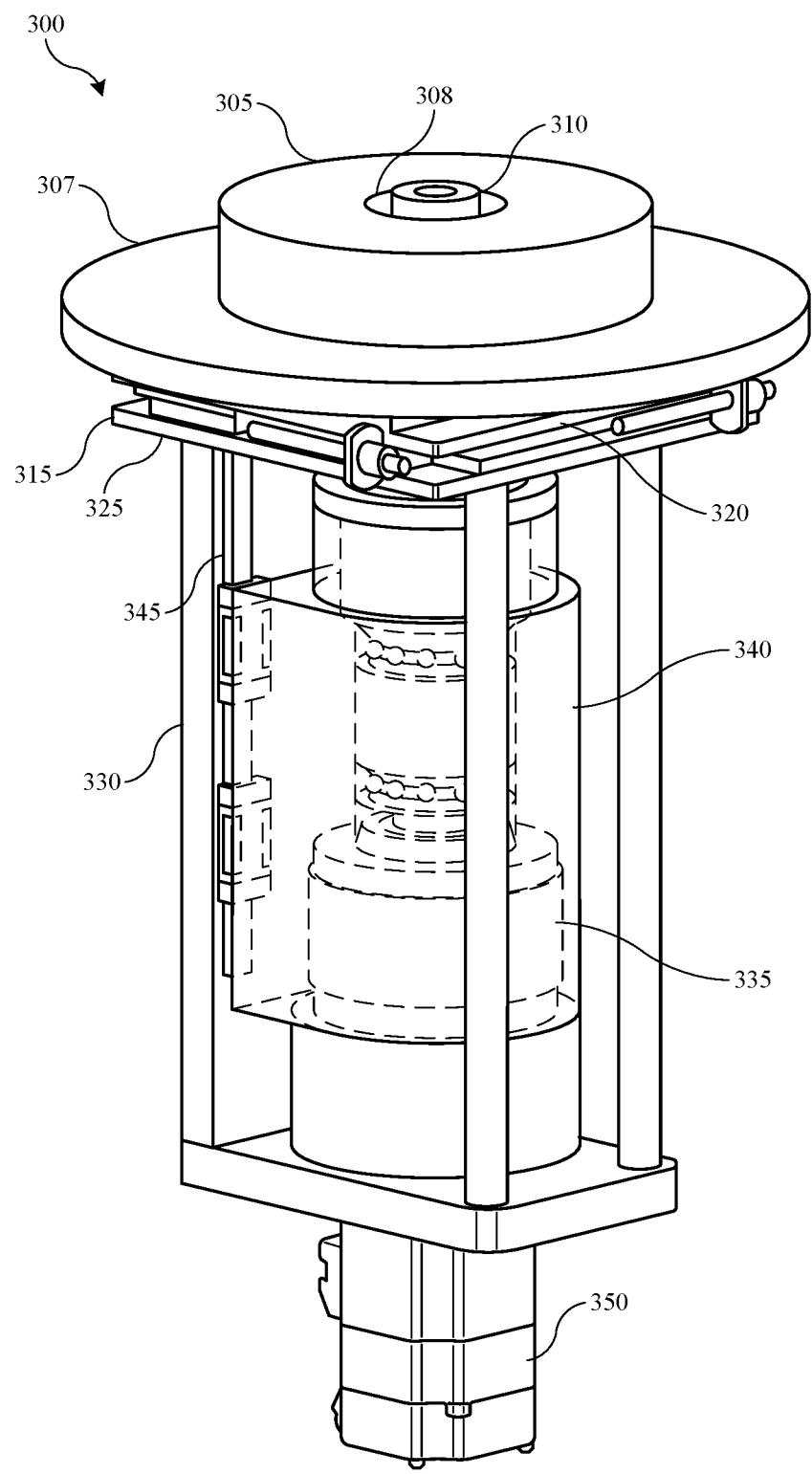
FIG. 3 shows a schematic isometric view of an exemplary transfer apparatus according to some embodiments of the present technology.

The transfer apparatus 220 may include a number of components and configurations that may facilitate the movement of the end effector in multiple directions, which may facilitate rotational movement, as well as vertical movement, or lateral movement in one or more ways with the drive system components to which the end effector may be coupled. FIG. 3 shows a schematic isometric view of an exemplary transfer apparatus 300 according to some embodiments of the present technology, although it is to be understood that any other configurations affording the rotational, vertical, and/or lateral movement to be described are similarly encompassed by the present technology.

The transfer apparatus 300 may include a baseplate 305, which may be coupled with a transfer chamber housing in one or more ways, and may operate as central hub 225 having a variety of components coupled or associated with the baseplate in embodiments of the present technology. For example, baseplate 305 may couple with an exterior of transfer region housing 205 previously illustrated, such as with flange 307, or an outer portion of the baseplate. A portion of baseplate 305 may extend through or at least partially within a base of the transfer chamber housing, such as through an aperture defined in the transfer region housing, and may be centrally located within the transfer region housing in some embodiments.

A shaft 310 may extend through the baseplate 305 into a transfer region volume, and may support an end effector as previously described. The end effector may couple with a distal end of shaft 310 extending into the transfer region. In some embodiments, baseplate 305 may be the only component coupled with the transfer region housing, and the other components of transfer apparatus 300 may have limited or no contact with the transfer chamber housing. Baseplate 305 may define an aperture 308 through which shaft 310 may extend. Aperture 308 may be at least partially aligned with the aperture through the transfer region housing in some embodiments, and aperture 308 may be sized to accommodate an amount of lateral movement of shaft 310 as will be described further below.

Coupled with baseplate 305 may be a lateral translation apparatus 315, which may be coupled on a surface of the baseplate 305 opposite a surface coupled with a transfer region housing. Lateral translation apparatus 315 may include a number of components affording movement in one or more directions along a plane orthogonal to a central axis through shaft 310 in some embodiments, and may allow lateral movement of the shaft within the central aperture of the baseplate. Lateral translation apparatus 315 may include a first stage 320, a portion of which may be coupled with baseplate 305. First stage 320 may include a number of components as will be described below, and may include one or more guides that may be driven by a motor to move components coupled with the stage in a first direction normal to a central axis through the shaft 310.

In some embodiments lateral translation apparatus 315 may also include a second stage 325, a portion of which may be coupled with first stage 320. Second stage 325 may include components similar to first stage 320, and in some embodiments first stage 320 and second stage 325 may be similar or identical. The stages may be offset in one or more ways to facilitate additional translational capabilities. For example, in some embodiments second stage 325 may afford component movement in a second direction normal to a central axis through the shaft 310. The second direction may also be offset from the first direction, and in some embodiments the second direction may be orthogonal to the first direction within a plane orthogonal to the central axis through the shaft 310. Accordingly, lateral translation apparatus 315 may provide at least one direction of lateral movement of components of the transfer apparatus 300, including shaft 310, and an end effector coupled with the shaft. Aspects of the lateral translation apparatus will be discussed further below. Lateral movement of shaft 310 may provide increased control over a substrate within a processing chamber, and may allow correction of the substrate position for delivery to a substrate support to ensure accuracy and limit damage to the substrate due to misalignment.

Coupled with lateral translation apparatus 315 may be a support structure 330, which may extend from lateral translation apparatus 315 in some embodiments. Shaft 310 may extend through the lateral translation apparatus 315 at a distal end extending into a transfer region housing or other chamber. A proximal end of shaft 310 may be coupled with one or more drive systems for moving shaft 310, and a coupled end effector, in one or more ways. FIG. 3 illustrates one embodiment of a first drive 335 configured to produce rotational movement of shaft 310. First drive 335 may be any number of drives or motors producing rotation of shaft 310 about a central axis of shaft 310. As illustrated in the figure, one embodiment may include a motor extending about shaft 310, and concentric with the shaft. The motor may be any type of motor and may couple with the shaft in a number of ways to rotate the shaft. As one non-limiting example, a frameless motor may extend about the shaft, and a rotor may magnetically couple with the shaft or may incorporate a number of bearings coupling with the shaft. Any other type of drive system, such as a belt-drive system, a gear-drive system, or other system configured to rotate the shaft may be used.

A housing 340 may extend about one or more components in some embodiments, and may at least partially extend about the shaft. First drive 335 may be contained within the housing 340 in some embodiments, although additional embodiments may include aspects of first drive 335 external to the housing, as will be described further below. Housing 340 may be coupled with support structure 330 in some embodiments in which the transfer apparatus 300 provides vertical movement in addition to rotational movement and/or lateral movement of shaft 310. In some embodiments, support structure 330 may include one or more guides 345, such as linear guides or rails, along which housing 340 may be driven. Attached to housing 340 may be one or more brackets or bearings allowing the housing to translate along and be moveably coupled with the guides 345. This may vertically translate the housing and shaft, which may then allow vertical motion of the end effector to facilitate engaging and disengaging substrates between the transfer apparatus and substrate supports. A second drive 350 may be coupled with the housing 340 and or the shaft 310, which may include any number of motors or materials to drive the shaft and/or other components along the linear guides on support structure 330. As illustrated in FIG. 3, in some embodiments the first drive and the second drive may be vertically aligned with the shaft to limit moments during operation. For example, as illustrated, the second drive 350 may be centrally mounted on a base of the support structure 330, and in line with both the shaft and first drive. This may lessen or limit any rotational or bending moments on the transfer device and associated components, such as shaft 310.

Figure 4:
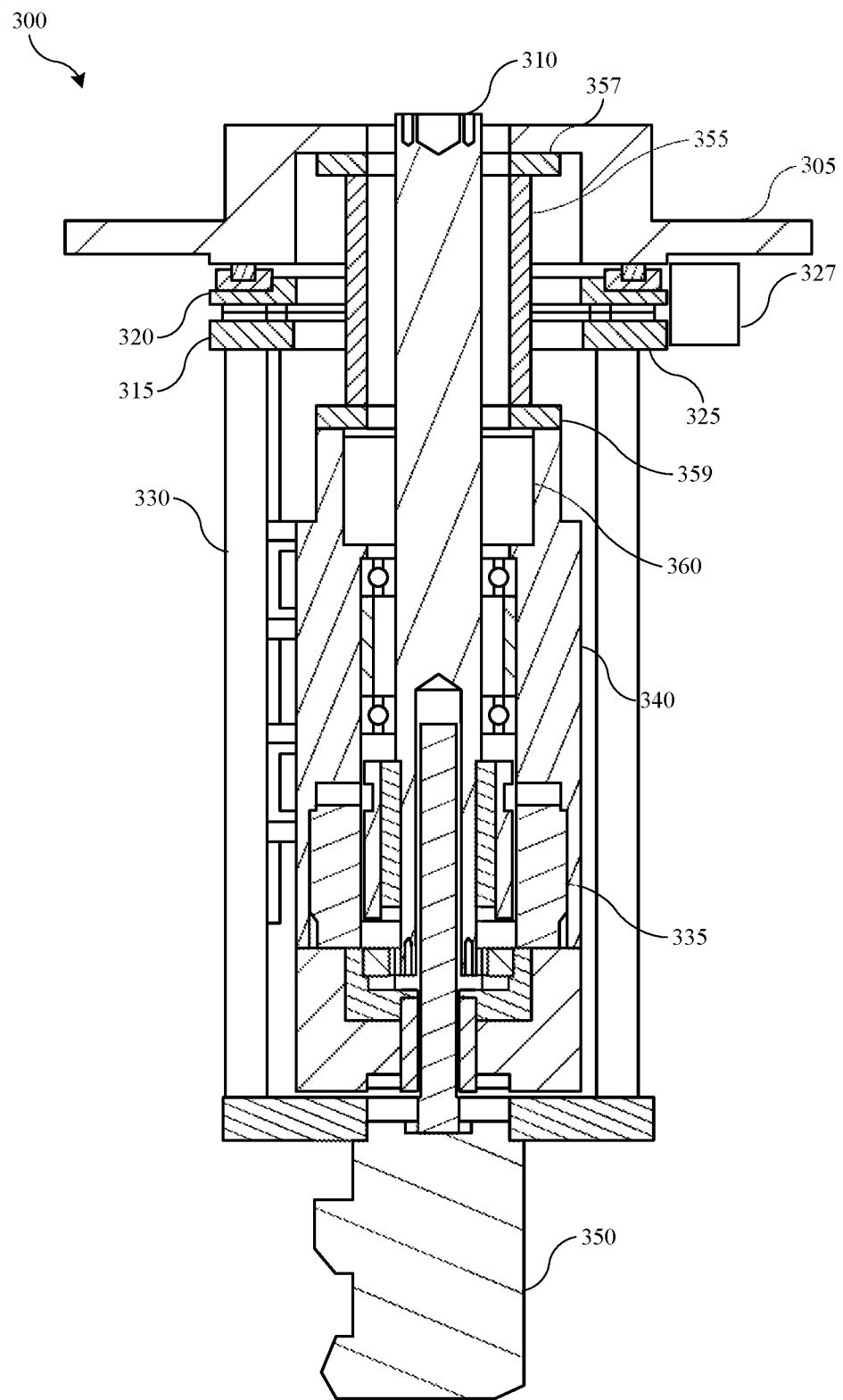
FIG. 4 shows a schematic cross-sectional view of an exemplary transfer apparatus according to some embodiments of the present technology.

FIG. 4 shows a schematic cross-sectional view through exemplary transfer apparatus 300 according to some embodiments of the present technology, which may illustrate additional components of the system. The cross-sectional view may illustrate exemplary couplings between components, as well as one example of alignment of the components of the transfer apparatus 300. For example, the figure shows alignment of second drive 350 with shaft 310 along with a concentric alignment of first drive 335 with shaft 310.

In some embodiments the transfer region into which the shaft 310 may extend may be under vacuum conditions. Some embodiments of the present technology may maintain each of the drive components external to the vacuum environment. To accommodate both different environmental pressures as well as the movement of the shaft, a bellows 355 and seal 360 may also be incorporated within the system. Bellows 355 may extend about the shaft, and shaft 310 may at least partially extend through the bellows at a distal end before entering a transfer region. Bellows 355 may be axially aligned with the aperture through baseplate 305, through which shaft 310 may extend. Bellows 355 may be coupled with a surface of the baseplate 305, such as at a second surface opposite a first surface, with which the baseplate 305 may be coupled with a transfer region housing. The bellows 355 may be fixedly coupled with the baseplate 305 at a first end 357 of the bellows. A second end 359 of the bellows may be coupled, including fixedly coupled with the housing 340. Seal 360, which may be a lip seal or other sealing device, may extend about the shaft 310 and abut the bellows to produce a pressure differential, where through bellows and about the distal end of shaft 310 may be maintained at a pressure of the transfer region environment, while the other illustrated components of transfer apparatus 300 may be maintained at higher pressure, for example. Because of the temperatures to which components of transfer apparatus 300 may be exposed, this configuration may also facilitate cooling baseplate 305, as well as housing 340 and components included therein, which may limit temperature effects on the components. For example, jacketing including fluid cooling jacketing may be extended about either of these components to limit the temperature of components during processing operations. Additional cooling may similarly be used and is also encompassed by the present technology.

Bellows 355 may accommodate vertical translation of the shaft 310 by flexing with the movement of the housing. Additionally, bellows 355 may be specifically configured to accommodate lateral movement of the shaft 310. As previously discussed, lateral translation apparatus 315 may be coupled with baseplate 305. As illustrated, first stage 320 of lateral translation device 315 may also include linear guides or rails along which the stage may move. For example, rails of first stage 320 may be coupled with baseplate 305, and first stage 320 may be driven along these rails in a first direction, such as orthogonal to a plane of the cross-section illustrated. A motor may be coupled with the first stage to drive the stage along the rails. Similarly, second stage 325 may be coupled with first stage 320, and may be rotated, such as ninety degrees, from first stage 320 to provide lateral movement in the same plane but orthogonal to first stage 320. A second motor, such as motor 327 may drive the second stage along rails that may be coupled with the first stage. Support structure 330 may be coupled with the second stage, and thus operation of the first stage and/or second stage may move each of the associated components, which may be coupled with the structure or with other components coupled with the structure. Hence, the movement of either stage will indirectly move the shaft laterally within the aperture through baseplate 305.

The movement may also move the shaft laterally within the bellows 355, as well as at least partially move aspects of the bellows in some embodiments. As shown, both first stage 320 and second stage 325 may define an aperture through which the bellows 355 may extend. As noted previously, bellows 355 may be coupled with baseplate 305 at first end 357 of the bellows, which may not move during operation of the first stage and/or second stage. However, the second end 359 of bellows 355, which may be coupled with the housing 340, may move when the structure and associated components including housing 340 are moved with the first stage and second stage. Thus, second end 359 of bellows 355 may deflect laterally, and become vertically offset from first end 357. Shaft 310 may maintain a central alignment with second end 359 of bellows 355, as these components may move together. Shaft 310 may, however, move towards internal radial edges of first end 357 of bellows 355 during these movements, as a position of first end 357 may remain fixed during lateral movements. Consequently, in some embodiments, a diameter of bellows 355 at first end 357 may be sized to accommodate the lateral movement of shaft 310, and the second end of bellows 355, to ensure shaft 310 may not contact bellows 355. The diameter of bellows 355 may be maintained constant along the length of the bellows, or may flare from the second end 359 towards the first end 357, to accommodate the movement and limit or prevent contact between the shaft 310 and sidewalls or ends of the bellows.

Additionally illustrated in FIG. 4 are further details of the second drive 350, which may couple with components in one or more ways. For example, second drive 350 may include a ball-screw motor, or any other motor which may provide vertical linear translation of a component coupled with a shaft of the motor. As illustrated, second drive 350 may be coupled with a base of support structure 330, and may be coupled with shaft 310 through housing 340, such as with a ball nut or other transition device allowing rotation of the drive shaft or screw while the nut and associated components, such as the housing and shaft, remain fixed rotationally while translating vertically. Consequently, transfer apparatus 300 may provide one or more, including multiple, movements of shaft 310, which may include one or more of rotational movement with first drive 335, vertical movement with second drive 350, and lateral movement with lateral translation apparatus 315.

Figure 5:
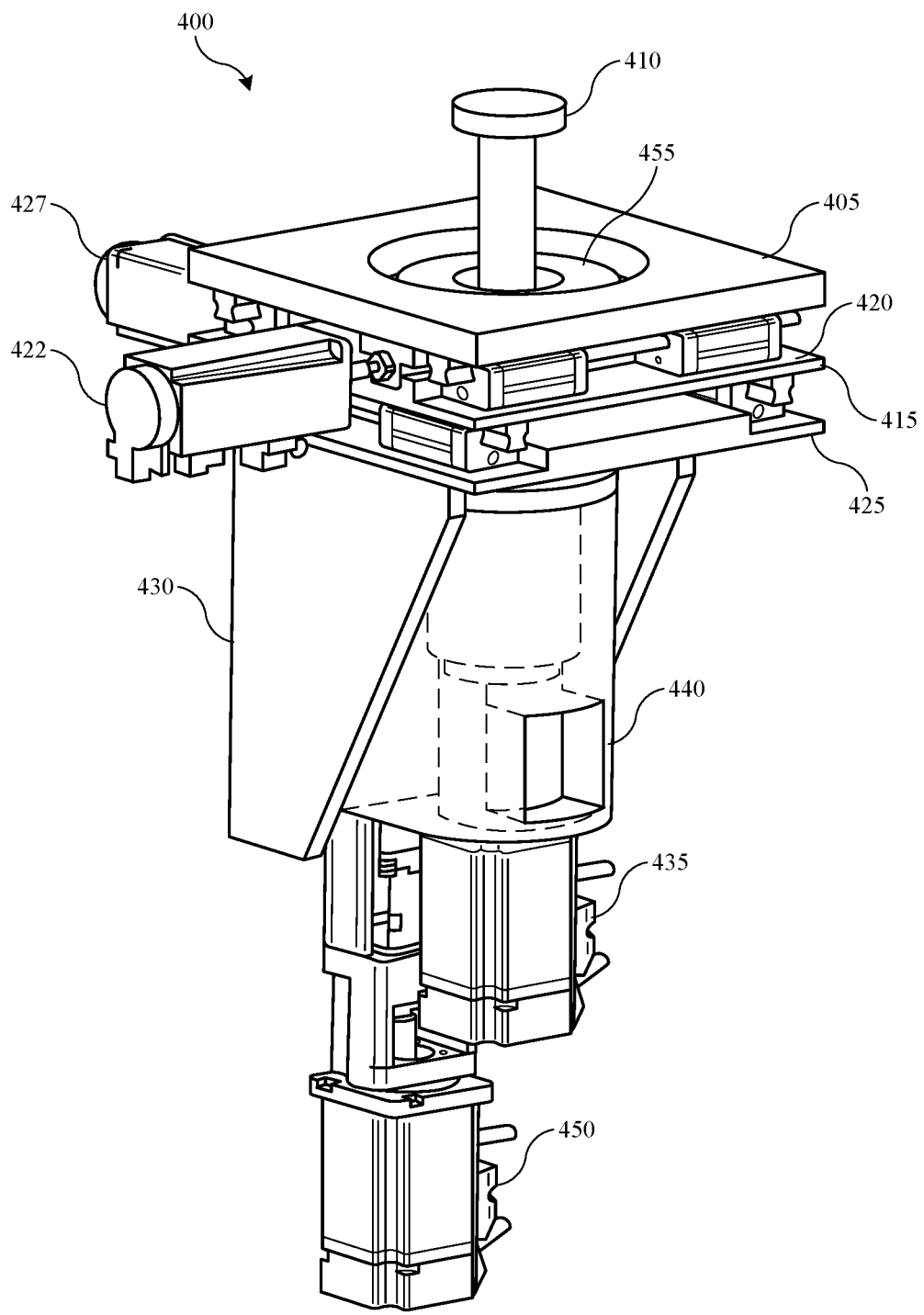
FIG. 5 shows a schematic isometric view of an exemplary transfer apparatus according to some embodiments of the present technology.

Additional configurations of a transfer apparatus are also encompassed by the present technology, which may not include the axial alignment of the first drive and second drive as illustrated above. FIG. 5 shows a schematic isometric view of an exemplary transfer apparatus 400 according to some embodiments of the present technology. Transfer apparatus 400 may be similar to transfer apparatus 300 in one or more ways, and may include any of the components, materials, or configurations described previously, even if not expressly illustrated in the figure, and may further illustrate some aspects of transfer apparatus 300 described above.

For example, transfer apparatus 400 may include a baseplate 405 that may be coupled with a transfer region housing as previously described. Baseplate 405 may define a central aperture, or general aperture, through which a shaft 410 may extend. An end effector may be coupled with a distal end of the shaft 410 as previously described. The shaft 410 may also extend through a bellows 455, which may extend through apertures through a lateral translation apparatus 415. The lateral translation apparatus may include one or more stages having components allowing lateral movement of the shaft, which may be indirectly coupled with the lateral translation apparatus. In some embodiments, lateral translation apparatus 415 may include a first stage 420 affording lateral movement in a first linear direction, which may be driven by a motor 422. Additionally, in some embodiments lateral translation apparatus 415 may include a second stage 425 affording lateral movement in a second linear direction in the same plane as and orthogonal to the first linear direction. Second stage 425 may be driven by a motor 427 in some embodiments.

Coupled with lateral translation apparatus 415 may be a support structure 430, which may include guides as previously discussed, along which housing 440, along with shaft 410, may be vertically translated. FIG. 5 illustrates an embodiment in which first drive 435 may not extend about shaft 410, and may be positioned externally from housing 440. First drive 435 may still be coupled with shaft 410 through housing 440 to provide rotational movement of shaft 410, although a different motor, such as a servo motor or other motor may be included providing rotational capabilities for shaft 410 rotation. Second drive 450 may also be included in some embodiments to provide vertical translation capabilities as previously described. However, in some embodiments second drive 450 may be laterally offset, as well as vertically offset, from first drive 435. Second drive 450 may be coupled with housing 440, or bearings of housing 440 allowing housing 440 to be translated along guides of structure 430. In some embodiments such as illustrated, second drive 450 may not be coupled with shaft 410, although movement with second drive 450 of housing 440, in which shaft 410 may be contained, may still vertically translate the shaft 410 as well. Accordingly, a number of configurations may be accommodated by the present technology to provide the multiple movements of a shaft, and associated end effector, which may allow rotation, as well as vertical and/or lateral movement of substrates within a transfer region of a processing system.

Figure 6:
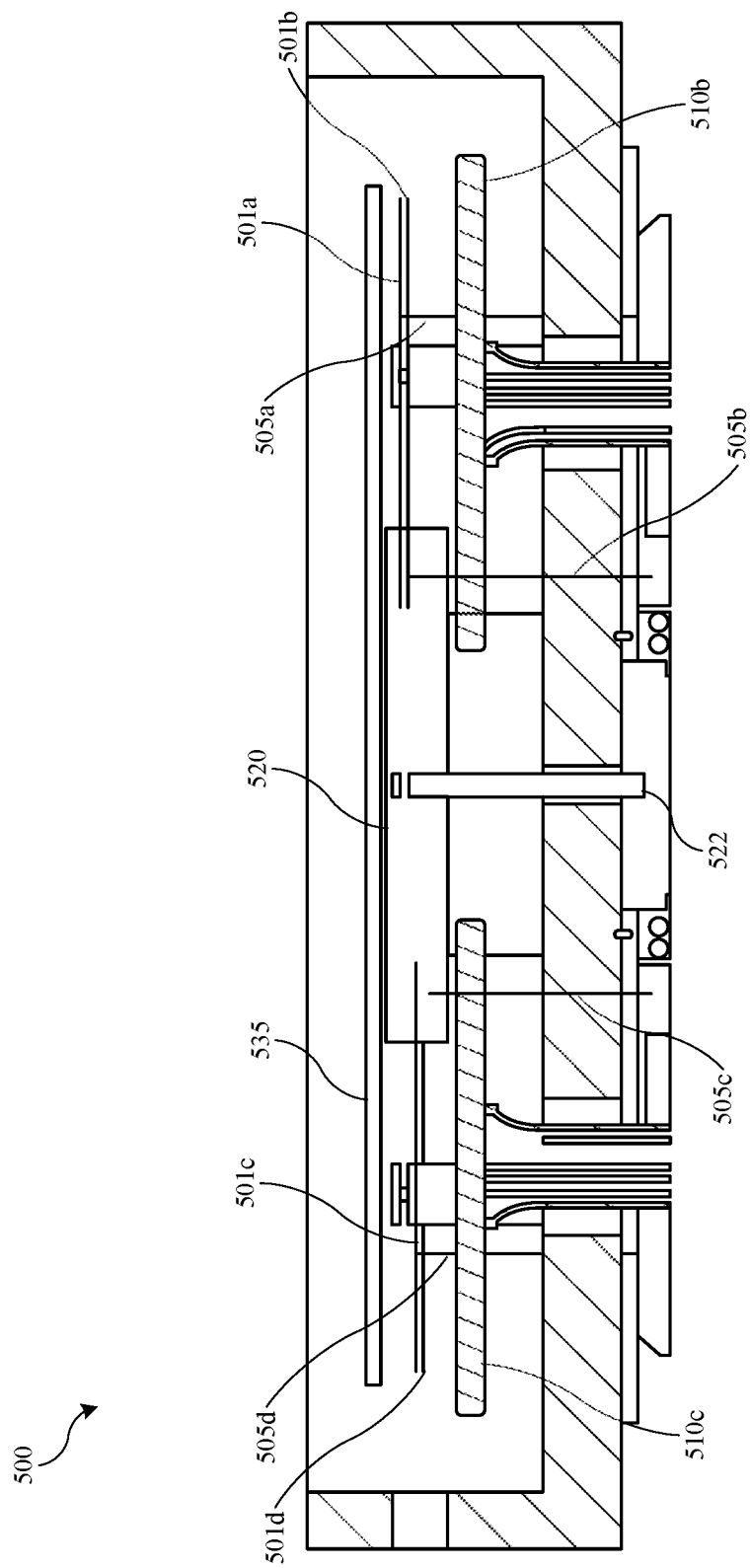
FIG. 6 shows a schematic cross-sectional elevation view of a transfer section of an exemplary substrate processing system according to some embodiments of the present technology.

FIG. 6 shows a schematic cross-sectional elevation view of an exemplary transfer region of a substrate processing system 500 according to some embodiments of the present technology. FIG. 6 illustrates a staggered lift pin configuration as previously described, and as may be included in any of the transfer chambers or substrate handling systems previously described. For example, any of the lift pins described previously may include staggered height lift pins as illustrated. Substrate handling system 500 may include any of the components, configurations, and characteristics of any of the previously described embodiments, and similarly any previously described system may include the lift pin configuration illustrated. System 500 may include a plurality of substrates 501 individually positioned on sets of lift pins 505 within the chamber, which may also include a transfer apparatus 520, which may include features of any of the transfer apparatuses previously described, including arms 535 extending from the transfer apparatus. Additionally, the transfer apparatus 520 may include a shaft 522 to which an end effector having arms 535 may be coupled. Shaft 522 may also extend through an aperture of the base of transfer region housing, and extend to any of the transfer apparatus drive systems discussed above or otherwise encompassed by the present technology, including drive systems of transfer apparatus 300 and transfer apparatus 400, for example.

Lift pins 505 may be sets of pins that extend from substrate supports 510 to provide accessibility for delivering or retrieving a substrate 501, and each set may include any number of pins to accommodate a substrate. As illustrated, lift pin sets 505 are staggered at four different heights, which may allow individual delivery and retrieval of substrates. For example, lift pins 505a may extend a first vertical length above a substrate support. Lift pins 505b may extend a second vertical length above substrate support 510b illustrated in the cross-section, and which may hide a substrate support from which lift pins 505a may extend, although the substrate supports may be in line. The second vertical length may be less than the first vertical length as shown.

Additionally, lift pins 505c may extend a third vertical length from substrate support 510c, and the third vertical length may be less than the second vertical length. Finally, lift pins 505d may extend a fourth vertical length from an associated substrate support, which may be hidden by and in line with substrate support 510c. The fourth vertical length may be less than the third vertical length. By staggering the heights of the lift pin sets, individual adjustments may be made to each substrate prior to delivery or retrieval of the substrates. For example, when disposed on the associated lift pins, substrate 501a may be accessible above substrate 501b, which may be accessible above substrate 501c, and which may be accessible above substrate 501d.

The present technology includes substrate processing systems that may accommodate additional substrate supports that may not otherwise be accessible to centrally located transfer robots as previously described. By incorporating transfer apparatuses according to embodiments of the present technology, multiple substrate supports may be utilized and accessed during substrate processing. When transfer apparatuses include drive systems as described above, lateral translation may be provided in addition to rotational translation and vertical translation. Additionally, transfer apparatus configurations according to some embodiments of the present technology may align components in one or more ways to limit moments during operation of the system, which may provide additional control for fine-tune movement of substrates during transition within a transfer region of a processing system.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a substrate" includes a plurality of such substrates, and reference to "the arm" includes reference to one or more arms and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate processing system comprising:
a transfer region housing defining a transfer region fluidly coupled with a plurality of processing regions, wherein a sidewall of the transfer region housing defines a sealable access for providing and receiving substrates;
a plurality of substrate supports disposed within the transfer region; and
a transfer apparatus comprising:
a central hub including a shaft extending at a distal end through the transfer region housing into the transfer region,
a lateral translation apparatus coupled with an exterior surface of the transfer region housing, the lateral translation apparatus configured to provide at least one direction of lateral movement of the shaft, and an end effector coupled with the shaft at the distal end of the shaft within the transfer region, the end effector comprising a plurality of arms having a number of arms equal to a number of substrate supports of the plurality of substrate supports.

2. The substrate processing system of claim 1, wherein the plurality of substrate supports comprises at least four substrate supports.

3. The substrate processing system of claim 1, further comprising a first drive coupled with the shaft and configured to rotate the shaft about a central axis through the shaft.

4. The substrate processing system of claim 3, wherein the first drive comprises a frameless motor extending about the shaft.

5. The substrate processing system of claim 4, further comprising a second drive coupled with the shaft and configured to provide vertical translation of the shaft.

6. The substrate processing system of claim 5, wherein the first drive is contained within a housing coupled with guides along which the second drive directs the housing, and which vertically translates the first drive and the shaft.

7. The substrate processing system of claim 1, wherein the lateral translation apparatus comprises a first stage translatable in a first lateral direction, and wherein the central hub is coupled with the first stage.

8. The substrate processing system of claim 7, wherein the lateral translation apparatus comprises a second stage translatable in a second lateral direction, and wherein the second stage is vertically aligned and coupled with the first stage.

9. The substrate processing system of claim 8, wherein the second lateral direction is orthogonal to the first lateral direction.

10. The substrate processing system of claim 1, further comprising a bellows through which the shaft extends, wherein the bellows is fixedly coupled with a baseplate of the transfer apparatus at a first end, and wherein the bellows is sized to afford lateral translation of the shaft within a volume of the bellows.

11. A transfer apparatus comprising:
a baseplate defining a central aperture;
a shaft, a distal end of which at least partially extends through the central aperture of the baseplate;
a lateral translation apparatus coupled with the baseplate, the lateral translation apparatus configured to provide at least one direction of lateral movement of the shaft within the central aperture of the baseplate;
a bellows coupled with the baseplate and axially aligned with the central aperture of the baseplate, wherein the shaft at least partially extends through the bellows;
a first drive coupled with the shaft and configured to rotate the shaft about a central axis of the shaft; and
a support coupled with the lateral translation apparatus, wherein the support comprises:
one or more guides extending vertically along a surface of the support facing the shaft.

12. The transfer apparatus of claim 11, wherein the shaft is at least partially contained within a housing, wherein the housing is movably coupled with the guides of the support.

13. The transfer apparatus of claim 12, wherein a first end of the bellows is coupled with the baseplate, and wherein a second end of the bellows is coupled with the housing.

14. The transfer apparatus of claim 12, further comprising a second drive coupled with a base of the support, wherein the second drive is configured to drive the housing vertically along the guides of the support providing vertical translation of the shaft.

15. The transfer apparatus of claim 14, wherein the second drive is laterally offset from the first drive.

16. The transfer apparatus of claim 14, wherein the second drive is axially aligned with the first drive.

17. The transfer apparatus of claim 11, wherein the lateral translation apparatus comprises a first stage coupled with the baseplate and translatable in a first lateral direction, and wherein the bellows at least partially extends through the first stage.

18. The transfer apparatus of claim 17, wherein the lateral translation apparatus comprises a second stage translatable in a second lateral direction orthogonal to the first lateral direction, and wherein the second stage is vertically aligned with and coupled with the first stage, and wherein the bellows at least partially extends through the second stage.

19. A substrate processing system comprising:
a transfer region housing defining a transfer region fluidly coupled with a plurality of processing regions, wherein a sidewall of the transfer region housing defines a sealable access for providing and receiving substrates, and wherein a base of the transfer region housing defines an aperture;
a plurality of substrate supports disposed within the transfer region; and
a transfer apparatus comprising:
a baseplate defining a central aperture, wherein the baseplate is coupled with an exterior of the base of the transfer region housing, and wherein the central aperture of the baseplate extends about the aperture through the base of the transfer region housing;
a shaft, a distal end of which at least partially extends through the central aperture of the baseplate;
a lateral translation apparatus coupled with the baseplate, the lateral translation apparatus configured to provide at least one direction of lateral movement of the shaft within the central aperture of the baseplate;
a bellows coupled with the baseplate and axially aligned with the central aperture of the baseplate, wherein the shaft at least partially extends through the bellows; and
an end effector coupled with the shaft at the distal end of the shaft within the transfer region, the end effector comprising a plurality of arms configured to support substrates.

* * * * *